United States Patent
Kim (10) Patent No.: US 10,446,429 B2
(45) Date of Patent: Oct. 15, 2019

(54) APPARATUS AND METHOD FOR TREATING SUBSTRATE

(71) Applicant: SEMES CO., LTD., Chungcheongnam-do (KR)

(72) Inventor: Duk Sik Kim, Chungcheongnam-do (KR)

(73) Assignee: SEMES CO., LTD., Chungcheongnam-Do (KR)

(*) Notice: Subject to any disclaimer, the term of this patent is extended or adjusted under 35 U.S.C. 154(b) by 218 days.

(21) Appl. No.: 15/631,192

(22) Filed: Jun. 23, 2017

(65) Prior Publication Data
US 2017/0372933 A1    Dec. 28, 2017

(30) Foreign Application Priority Data
Jun. 24, 2016    (KR) .................. 10-2016-0079171

(51) Int. Cl.
| | | |
|---|---|---|
| *G06F 19/00* | (2018.01) | |
| *H01L 21/68* | (2006.01) | |
| *H01L 21/677* | (2006.01) | |
| *H01L 21/687* | (2006.01) | |
| *H01L 21/683* | (2006.01) | |

(52) U.S. Cl.
CPC ........ *H01L 21/68* (2013.01); *H01L 21/67742* (2013.01); *H01L 21/67748* (2013.01); *H01L 21/681* (2013.01); *H01L 21/68707* (2013.01); *H01L 21/6835* (2013.01)

(58) Field of Classification Search
CPC ......... H01L 21/67742; H01L 21/67748; H01L 21/68; H01L 21/681; H01L 21/6835; H01L 21/68707
See application file for complete search history.

(56) References Cited

U.S. PATENT DOCUMENTS

| | | | | |
|---|---|---|---|---|
| 6,168,668 B1* | 1/2001 | Yudovsky | ............... | H01L 21/68 118/715 |
| 2004/0002172 A1* | 1/2004 | Goo | ...................... | H01L 21/681 438/7 |
| 2005/0016818 A1* | 1/2005 | Ito | ...................... | B05B 13/0228 198/345.1 |
| 2009/0252580 A1* | 10/2009 | Takizawa | .............. | H01L 21/681 414/222.02 |

(Continued)

FOREIGN PATENT DOCUMENTS

| | | |
|---|---|---|
| KR | 10-1015778 B | 12/2004 |
| KR | 10-2006-0125308 A | 12/2006 |
| KR | 10-2010-0054908 A | 5/2010 |

(Continued)

*Primary Examiner* — Harry Y Oh
(74) *Attorney, Agent, or Firm* — Li & Cai Intellectual Property (USA) Office (57) ABSTRACT

A substrate treating apparatus comprises: an alignment unit for aligning a substrate placed in a support unit in position; and a teaching unit for setting a transfer position for transferring the substrate onto the support unit of the transfer unit, wherein the teaching unit correcting a transfer position of the transfer unit based on a difference value between a first position of a substrate placed on a hand of the transfer unit when the transfer unit is transferring the substrate and a second position of a substrate placed on the hand of the transfer unit that picks up the substrate aligned to the support unit in position.

17 Claims, 8 Drawing Sheets

(56) References Cited

U.S. PATENT DOCUMENTS

2015/0369583 A1* 12/2015 Potter, Sr. ......... H01L 21/67259
702/150
2017/0032510 A1* 2/2017 Francken .............. G06T 7/0004

FOREIGN PATENT DOCUMENTS

| KR | 10-2010-0082657 A | 7/2010 |
| KR | 10-2012-0100764 A | 9/2012 |
| KR | 10-2012-0113841 A | 10/2012 |
| KR | 10-2013-0037355 A | 4/2013 |
| KR | 10-2013-0091269 A | 8/2013 |
| KR | 10-2014-0012589 A | 2/2014 |

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2016-0079171 filed Jun. 24, 2016, in the Korean Intellectual Property Office, the entire contents of which are hereby incorporated by reference.

BACKGROUND OF THE INVENTION

The present disclosure relates to an apparatus and a method for treating a substrate.

Various processes of photolithography, etching, ion implantation, deposition, and cleaning are performed to fabricate semiconductor devices or liquid crystal displays. During this process, the substrate is transferred from one device to another. The handling of the substrate during the transfer process may be performed by a transfer unit such as a transfer robot.

When the transfer unit places the substrate on the support unit on which the substrate is supported, a teaching operation is performed so that the substrate is seated in the correct position. In general, such a teaching operation is performed by an operator manually operating a jog which can adjust the position of the hand supporting the substrate of the transfer unit, positioning the position of the hand at the position corresponding to the correct position, and by setting the hand position of the hand to the right position of the hand. In this case, however, there is a problem that a long operation time is required and an error is likely to occur by operating the operator directly.

SUMMARY OF THE INVENTION

The present disclosure provides an apparatus and a method that may reduce the teaching operation time of a transfer unit.

The present disclosure provides an apparatus and a method that may precisely teach a transfer unit.

The objects of the inventive concept are not limited to the above mentioned effects. Other objects thereof will be understandable by those skilled in the art from the following descriptions.

In example embodiment, a substrate treating apparatus comprises: a support unit for supporting the substrate; an alignment unit for aligning the substrate placed in the support unit in position; a transfer unit having a hand on which the substrate is placed and a position sensor for measuring the position of the substrate on the hand, and transferring the substrate to the support unit; and a teaching unit for setting a transfer position for transferring the substrate onto the support unit of the transfer unit, wherein the teaching unit comprising: a first position measuring step for measuring a first position of the substrate placed on the hand using the position sensor; a substrate seating step for seating the substrate placed on the hand on the support unit; an alignment step of aligning the substrate placed on the support unit in position; a substrate pickup step for picking up the substrate placed on the support unit from the support unit using the transfer unit; a second position measuring step for measuring a second position of the substrate placed on the hand using the position sensor; an offset determination step for determining a difference value between the first position and the second position; and a position correcting step for correcting a transfer position of the transfer unit based on the difference value; are sequentially performed to set the transfer position of the transfer unit.

In example embodiment, the alignment unit includes an alignment protrusion provided on the support unit and having an inclined surface inclined downward toward the center of the substrate positioned on the support unit on the inner surface thereof.

In example embodiment, a plurality of the alignment protrusions is provided spaced apart from each other so as to surround the substrate positioned on the support unit.

In example embodiment, an inner end of the alignment protrusions is provided in contact with or adjacent to the side of the substrate positioned on the support unit.

In example embodiment, the alignment unit includes: a substrate rotating member for rotating a substrate placed on the support unit; a moving member for moving the support unit in a horizontal direction; and a length measuring sensor for measuring the length of the rotating substrate from a center of a rotation of the rotating substrate to the end facing in a predetermined direction of the rotating substrate.

In example embodiment, the teaching unit controls the moving member to move the support unit such that the substrate is positioned in accordance with the length value measured by the length measuring sensor in the alignment step.

In example embodiment, the length measuring sensor may measure the length during one revolution of the substrate.

In example embodiment, the hand is provided with a vacuum hole forming vacuum pressure to adsorb the substrate.

An embodiment of the inventive concept provides a substrate treating apparatus according to another embodiment. The substrate treating apparatus comprises: a support unit for supporting the substrate and rotating the substrate; a transfer unit having a hand on which the substrate is placed and a position sensor for measuring the position of the substrate on the hand, and transferring the substrate to the support unit; and a teaching unit for setting a transfer position for transferring the substrate onto the support unit of the transfer unit, wherein the teaching unit comprising: a third position measuring step for measuring a third position of the substrate placed on the hand; a substrate seating step for seating the substrate placed on the hand on the support unit; a rotating step for rotating the substrate at a predetermined angle; a substrate pickup step for picking up the substrate placed on the support unit from the support unit using the transfer unit; a fourth position measuring step for measuring a fourth position of the substrate placed on the hand; an offset determination step for using a measured value of the third position and the fourth position to determine a difference value between the third position and a position of the substrate picked up by the hand when the substrate is placed in the support unit in position; and a position correcting step for correcting a transfer position of the transfer unit based on the difference value; are sequentially performed to set the transfer position of the transfer unit.

In example embodiment, the hand is provided with a vacuum hole forming vacuum pressure to adsorb the substrate.

In example embodiment, the predetermined angle may be 180 degrees.

An embodiment of the inventive concept provides a substrate treating method. The substrate treating method comprises: a first position measuring step for measuring a first position of a substrate placed on a hand of a transfer unit for transferring a substrate to a support unit for supporting the substrate; a substrate seating step for seating the substrate placed on the hand on the support unit; an alignment step of aligning the substrate placed on the support unit in position; a substrate pickup step for picking up the substrate placed on the support unit from the support unit using the transfer unit; a second position measuring step for measuring a second position of the substrate placed on the hand; an offset determination step for determining a difference value between the first position and the second position; and a position correcting step for correcting a transfer position of the transfer unit based on the difference value.

In example embodiment, in the alignment step, alignment protrusions provided on the support unit and having an inclined surface inclined downward toward the center of the substrate positioned on the support unit on the inner surface thereof may be used to align the substrate in place.

In example embodiment, in the alignment step, the substrate placed on the support unit may be rotated, and while the substrate is rotating, the length of the rotation of the rotating substrate from a center of a rotation to the end of the rotating substrate facing in a predetermined direction may be measured, and support unit may be moved so that the substrate is positioned in a correct position in accordance with the length value measured by the measurement.

In example embodiment, the length measurement may be performed during one revolution of the substrate.

An embodiment of the inventive concept provides a substrate treating method according to another embodiment. The substrate treating method comprises: a third position measuring step for measuring a third position of the substrate placed on the hand of a transfer unit for transferring a substrate to a support unit for supporting the substrate; a substrate seating step for seating the substrate placed on the hand on the support unit; a rotating step for rotating the substrate at a predetermined angle; a substrate pickup step for picking up the substrate placed on the support unit from the support unit using the transfer unit; a fourth position measuring step for measuring a fourth position of the substrate placed on the hand; an offset determination step for using a measured value of the third position and the fourth position in the third position measuring step and the fourth position measuring step to determine a difference value between the third position and a position of the substrate picked up by the hand when the substrate is placed in the support unit in position; and a position correcting step for correcting a transfer position of the transfer unit based on the difference value; are sequentially performed to set the transfer position of the transfer unit.

In example embodiment, the predetermined angle may be 180 degrees.

According to an example embodiment, the apparatus and method of the present invention may reduce the time required for teaching the transfer unit.

According to an example embodiment, the apparatus and method of the present invention may accurately teach the transfer unit.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
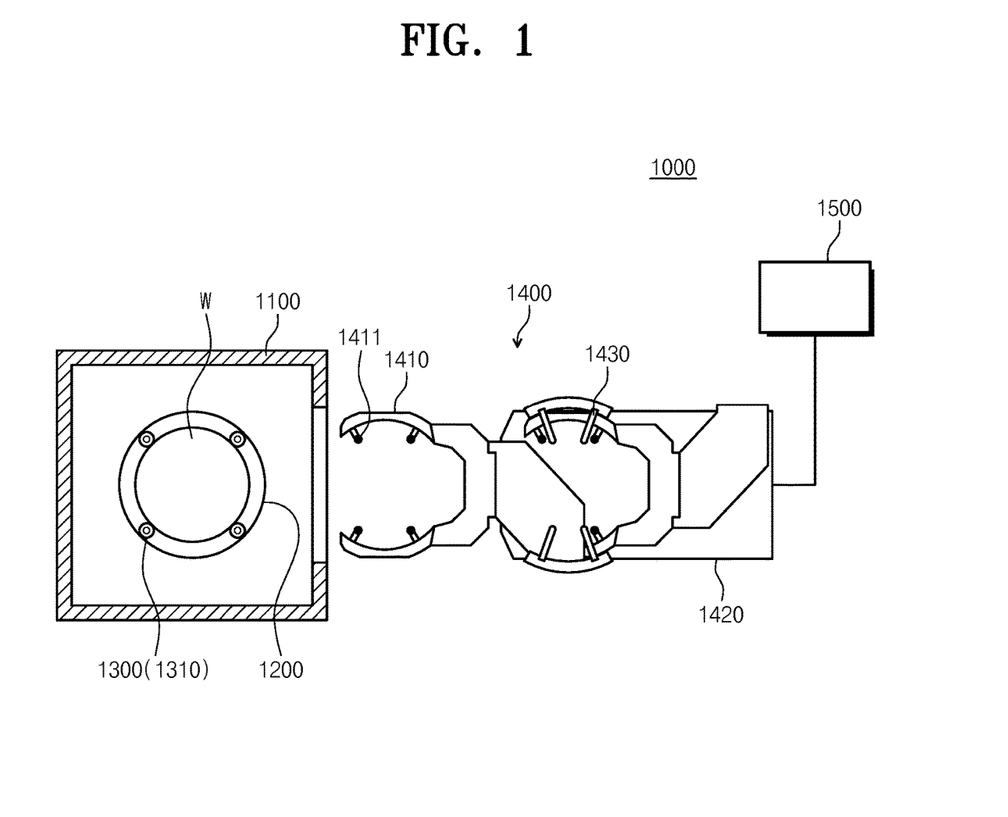
FIG. 1 is a plan view schematically showing a substrate treating apparatus according to an embodiment of the present invention.

FIG. 1 is a plan view schematically showing a substrate treating apparatus 1000 according to an embodiment of the present invention. Referring to FIG. 1, the substrate treating apparatus 1000 for treating a substrate W includes a process chamber 1100, a support unit 1200, an alignment unit 1300, a transfer unit 1400, and a teaching unit 1500.

The process chamber 1100 has a treating space in which the substrate W is processed. Various kinds of processes can be performed in the treating space. For example, in the treating space of the process chamber 1100, a liquid treatment process for supplying a liquid onto the substrate W to process the substrate W such as coating of a photoresist or cleaning, a plasma process processing the substrate W using plasma such as an etching, or an exposure process or the like may be performed. In addition, in the treating space of the process chamber 1100, various kinds of processes that require the substrate W to be placed on the support unit 1200 to be positioned may be performed.

The support unit 1200 supports the substrate within the process chamber 1100. The support unit 1200 may be provided to rotate the substrate W. The support unit 1200 may be provided as an electrostatic chuck for fixing the substrate W using an electrostatic force, or may be provided as a chuck for fixing the substrate W in a mechanical clamping manner. The support unit 1200 may be provided with a lift pin (not shown) for loading the substrate W onto the support unit 1200 or unloading the substrate placed on the support unit 1200.

Figure 2:
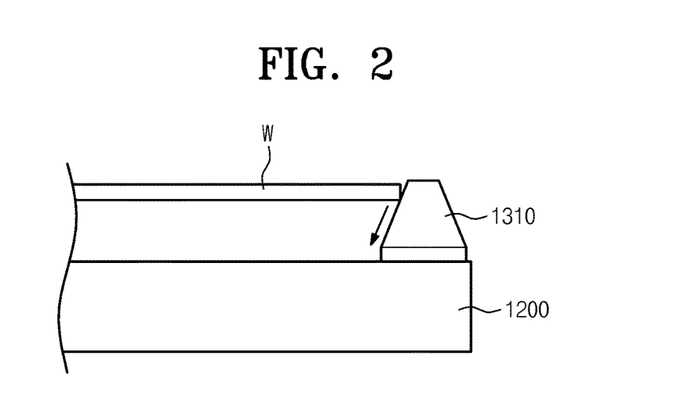
FIG. 2 is a side view schematically showing a part of the alignment unit of FIG. 1.

FIG. 2 is a side view schematically showing a part of the alignment unit of FIG. 1. Referring to FIGS. 1 and 2, the alignment unit 1300 aligns the substrate W placed in the support unit 1200 in place. The support unit 1200 is fixedly positioned with respect to the horizontal direction within the process chamber 1100. In this case, the correct position means the position where the substrate is properly placed on the support unit.

The alignment unit 1300 has alignment protrusions 1310. The alignment protrusion 1310 is provided on the support unit 1200. A plurality of alignment protrusions 1310 are provided so as to be spaced apart from each other so as to surround the substrate W positioned on the support unit 1200. The alignment protrusion 1310 has an inclined surface inclined downward toward the center of the substrate W positioned on the support unit 1200 on the inner side thereof. The inner end of the alignment protrusion 1310 is provided in contact with or adjacent to the side of the substrate W positioned on the support unit 1200. Therefore, when the transfer unit 1400 places the substrate W at a position deviating from the proper position on the support unit 1200, the misaligned substrate W is transferred along the contacted inner surface of the aligned alignment protrusion 1310 so as to be placed the support unit 1200 in position.

When setting the transport position of the transport unit 1400, the alignment unit may further comprise a monitoring member for displaying all measured and calculated values such as the first position, the second position, and the difference value for each substrate.

Figure 3:
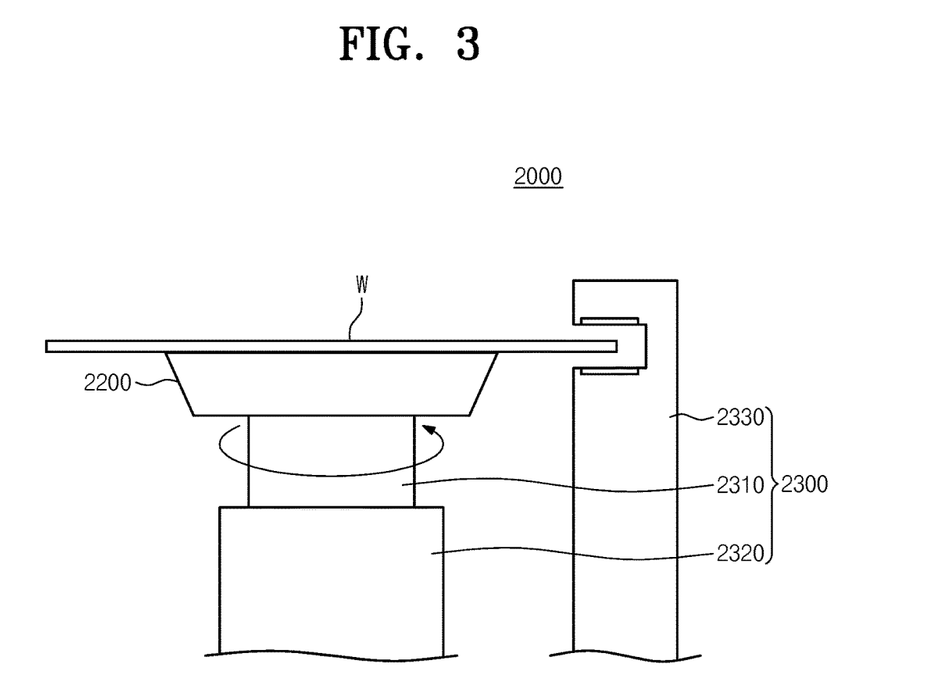
FIG. 3 is a side view schematically showing a support unit and alignment unit of a substrate treating apparatus according to another embodiment.
Figure 4:
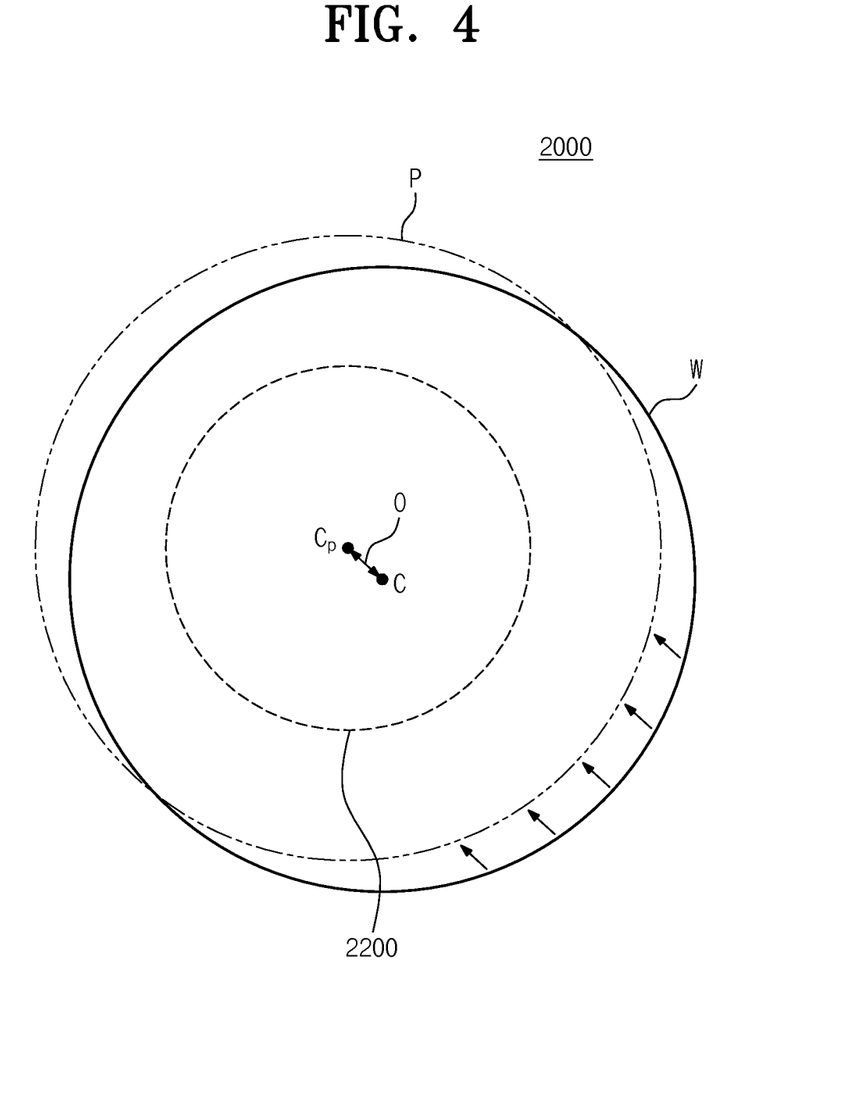
FIG. 4 is a top view of the support unit of FIG. 3.

Alternatively, the alignment unit may be provided in a variety of configurations and configurations that allow the substrate W to be positioned. FIG. 3 is a schematic side view of a support unit 2200 and alignment unit 2300 of a substrate treating apparatus 2000 according to another embodiment. FIG. 4 is a top view of the support unit 2200 of FIG. 3. Referring to FIGS. 3 and 4, for example, the alignment unit 2300 includes a substrate rotating member 2310, a moving member 2320, and a length measuring sensor 2330. Other configurations, structures, and functions of the substrate treating apparatus 2000, except for the alignment unit 2300, are the same as or similar to those of the substrate treating apparatus 1000 of FIG. 1. Therefore, thereafter, the substrate treating apparatus 2000 will be described on the assumption that the other configuration and structure except for the alignment unit 2300 are the same as the substrate treating apparatus 1000.

In the case of the substrate treating apparatus 2000, the correct position is not the position of the substrate W with respect to the upper surface of the support unit 2200 but the position of the substrate W with respect to the treating space in the process chamber 1100. For example, in the treating space of the process chamber 1100, an exposure process is performed, and the correct position of the substrate W may be the position of the substrate W suitable for the exposure process to be performed in the treating space. Other configurations, structures and functions of the substrate treating apparatus 2000 except for the alignment unit 2300 are the same as or similar to those of the substrate treating apparatus 1000 of FIG. 1. Therefore, thereafter, the substrate treating apparatus 2000 will be described on the assumption that the other configuration and structure except for the alignment unit 2300 are the same as the substrate treating apparatus 1000.

The substrate rotating member 2310 rotates the substrate W placed on the support unit 2200. The support unit 2200 is provided so that its center of rotation coincides with the center of the substrate W in place before performing the alignment step S13.

The moving member 2320 moves the support unit 2200 in a horizontal direction. The moving member 2320 moves the support unit 2200 such that the substrate W is in the correct position P according to the length value measured by the length measuring sensor 2330 while the substrate W is rotating, under the control of the teaching unit 1500. In this case, the difference value determined in the offset determination step S16 to be described later is a difference value between the position of the center C of the substrate W placed on the initial support unit 2200 and the center Cp of the substrate positioned at the right position P.

The length measuring sensor 2330 measures a length of the rotating substrate W on the support unit 2200 from a center of a rotation of the rotating substrate W to the end facing in a predetermined direction of the rotating substrate W. The length measuring sensor 2330 may be provided to measure the length of the substrate W during one revolution of the substrate W on the support unit 2200. The teaching unit 1500, in the offset determination step S16, determines the difference value between the first position and the second position to be described hereinafter from the fluctuation of the length value depending on the rotation angle change while the substrate W on the support unit 2200 rotates. For example, the length measuring sensor 2330 may be provided as a CCD (Charge-Coupled Device).

Other configurations, structures and functions of the substrate treating apparatus 2000 except for the alignment unit 2300 are the same as or similar to those of the substrate treating apparatus 1000 of FIG. 1.

Figure 7:
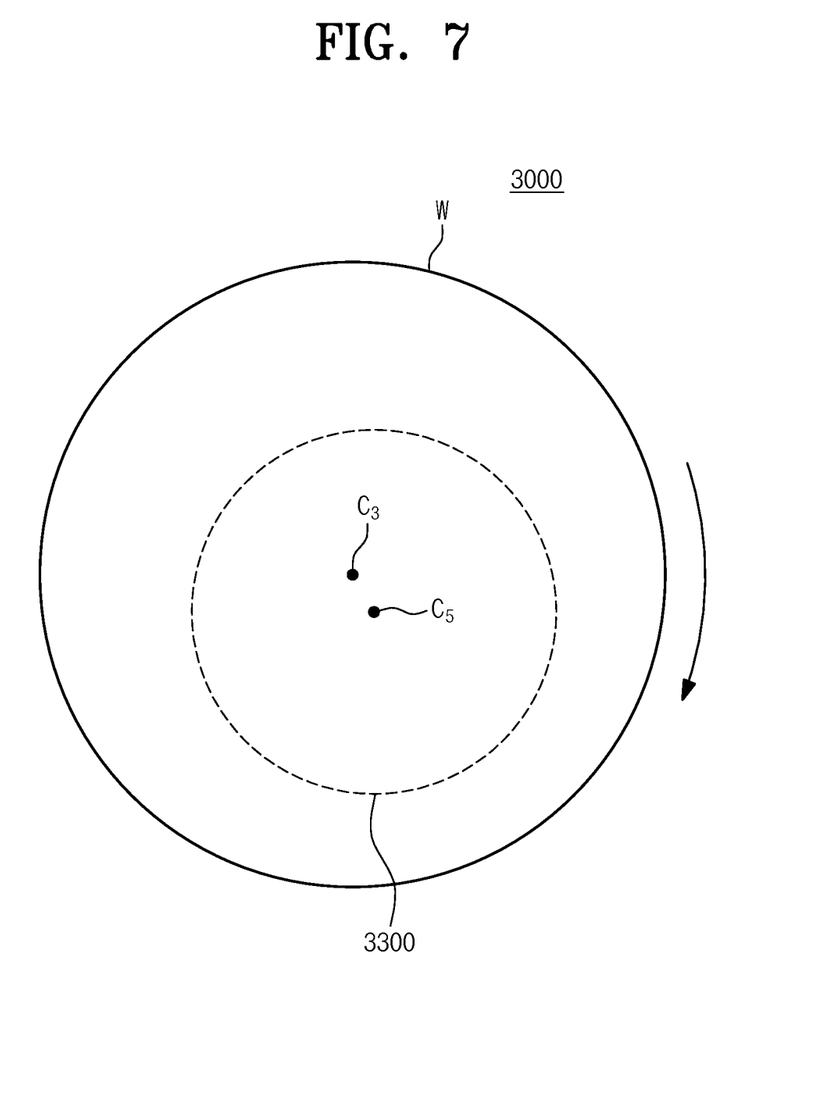
FIG. 7 is a plan view showing a support unit of a substrate treating apparatus according to another embodiment of the present invention.

FIG. 7 is a plan view showing a support unit 3300 of a substrate treating apparatus 3000 according to another embodiment of the present invention. Referring to FIGS. 1 and 7, unlike the substrate treating apparatus 1000 of FIG. 1, the substrate treating apparatus 3000 is not provided with an alignment unit (1300 of FIG. 1, 2300 of FIG. 3). The support unit 3300 is provided rotatable while supporting the substrate W. The position of the rotational center of the support unit 3300 coincides with the center of the substrate W positioned right on the support unit 3300. The configuration and structure of the substrate treating apparatus 3000 other than the alignment unit are the same as or similar to those of the substrate treating apparatus 1000 of FIG. 1.

Hereinafter, another embodiment of the substrate treating method of the present invention will be described using the substrate treating apparatus 3000 described above. It is assumed that the substrate treating apparatus 3000 has the same configuration as the substrate treating apparatus 1000 of FIG. 1 except for the alignment unit.

Figure 8:
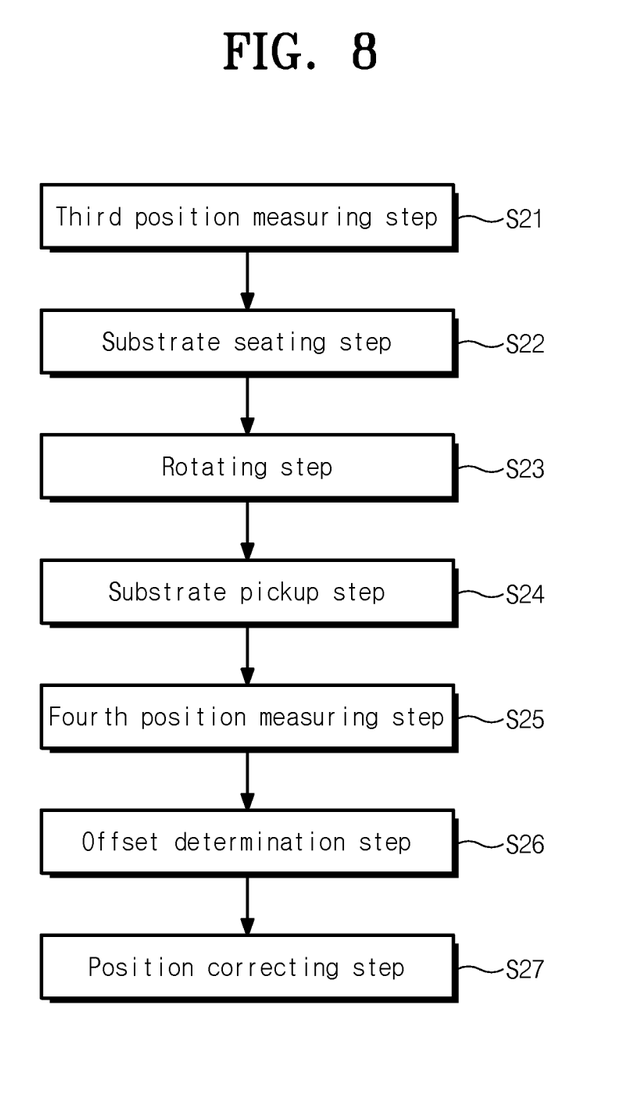
FIG. 8 is a flowchart illustrating a method of treating a substrate according to another embodiment of the present invention.

FIG. 8 is a flowchart illustrating a method of treating a substrate according to another embodiment of the present invention. Referring to FIGS. 1, 7, and 8, the substrate treating method includes a third position measuring step S21, a substrate seating step S22, a rotating step S23, a substrate pickup step S24, a fourth position measuring step S25, an offset determination step S26, and a correction step S27. The teaching unit 1500 sequentially performs a third position measuring step S21, a substrate seating step S22, a rotating step S23, a substrate pickup step S24, a fourth position measuring step S25, an offset determination step S26, and the position correcting step S27, and set the transfer position for correcting the transfer position of the transfer unit 1400. The transfer position of the transfer unit 1400 is corrected in accordance with the set transfer position.

In the third position measuring step S21, the third position of the substrate W placed on the hand 1410 is measured. The method for measuring the third position in the third position measuring step S21 is the same as the first position measuring step S11 in FIG. 6 to be described later.

The substrate seating step S22 is performed after the third position measuring step S21. The substrate seating step S22 is performed in the same manner as the substrate seating step S12 of FIG. 6 to be described later.

In the rotating step S23, the teaching unit 1500 controls the support unit 3300 to rotate the substrate W at a predetermined angle. For example, the teaching unit 1500 may control the support unit 3300 to rotate the substrate W by 180 degrees.

The substrate pickup step S24 is performed after the rotating step S23. The substrate pickup step S24 is performed in the same manner as the substrate pickup step S14 of FIG. 6 to be described later.

The fourth position measuring step S25 is performed after the substrate pickup step S24. In the fourth position measuring step S25, the fourth position of the substrate W placed on the hand 1410 is measured. The method of measuring the fourth position in the fourth position measuring step S25 is the same as the third position measuring step S21.

In the offset determination step S26, the teaching unit 1500 determines a difference value between the third position and a position (hereinafter referred to as the fifth position) of the substrate W picked up by the hand 1410 when the substrate W is placed on the support unit 3300 in position by using a measured value of the third position in the third position measuring step S21 and a measured value of the fourth position in the fourth position measuring step S25.

Figure 9:
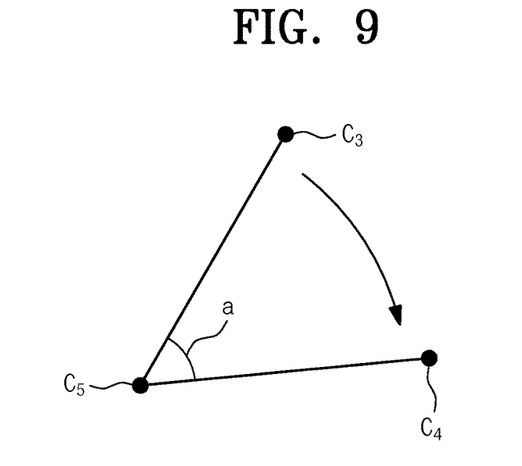
FIG. 9 is a view showing the center of the substrate positioned at the third position and the center of the substrate positioned at the fourth position when the substrate is rotated by $a°$ degrees in the rotating step.

FIG. 9 is a view showing the center of the substrate positioned at the third position and the center of the substrate positioned at the fourth position when the substrate is rotated by $a^0$ degrees in the rotating step. Referring to FIG. 9, the difference value between the position of the center C3 of the substrate W positioned at the third position and the position of the center C4 of the substrate W positioned at the fourth position is the same with the difference value between a position of the substrate W positioned at the third position and a position of the fourth position. Since the position of the center C3 of the substrate W positioned at the third position, the position of the center C4 of the substrate W positioned at the fourth position and the angle of the rotation are determined, the position of the center of the substrate W positioned at the fifth position can be obtained using the position of the center C3 of the substrate W positioned at the third position, the position of the center C4 of the substrate W positioned at the fourth position and the angle of the ratation. For example, since the position of the center of the substrate W positioned at the fifth position coincides with the position of the center of rotation of the support unit 3300, the length from the center C3 of the substrate W positioned at the third position to the position of the center C5 of the substrate W positioned at the fifth position, and the length from the position of the center C4 of the substrate W positioned at the fourth position to the position of the center C5 of the substrate W positioned at the fifth position are the same. Therefore, one equation may be made using the fact that these lengths are equal to each other. In addition, since another equation can be obtained using the second law of cosine, the teaching unit 1500 can obtain the value of x axis and y axis of the position of the horizontal plane of the center C5 of the substrate W positioned at the fifth position using the equation including the above two equations.

Figure 10:
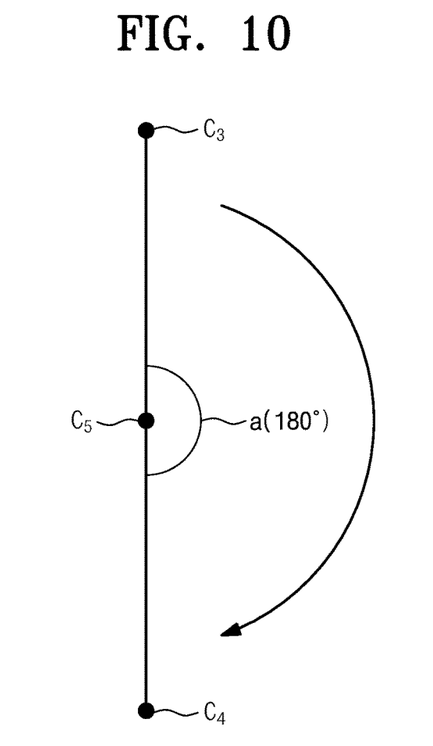
FIG. 10 is a view showing the center of the substrate positioned at the third position and the center of the substrate positioned at the fourth position when the substrate is rotated by 180 degrees in the rotating step.

FIG. 10 is a view showing the center C3 of the substrate W positioned at the third position and the center C4 of the substrate W positioned at the fourth position when the substrate is rotated by 180 degrees in the rotating step S23. Referring to FIG. 10, unlike the above case, When the substrate W is rotated by 180 degrees in the rotation step S23, the position of the center C3 of the substrate W positioned in the third position, the position of the center C4 of the substrate W positioned at the fourth position, and the position of the center C5 of the substrate W positioned at the fifth position are straight lines. A length from The position of the center C3 of the substrate W positioned at the third position to the position of the center of the substrate W positioned at the fifth position, and a length from the position of the center C4 of the substrate W positioned at the fourth position to the position of the center of the substrate W positioned at the fifth position are the same. Therefore, the teaching unit 1500 may determine a middle point of the center position of the center C3 of the substrate W positioned at the third position between the center position of the position of the center C4 of the substrate W positioned at the fourth position as the position of the center C5 of the substrate W positioned at the fifth position.

In the position correcting step S27, the teaching unit 1500 corrects the transfer position of the transfer unit 1400 based on the difference value determined in the offset determining step S26. That is, the teaching unit 1500 corrects the transfer position of the transfer unit 1400 so that the position of the transfer unit 1400 when placing the substrate W on the support unit 3300 is shifted by a difference value.

Figure 5:
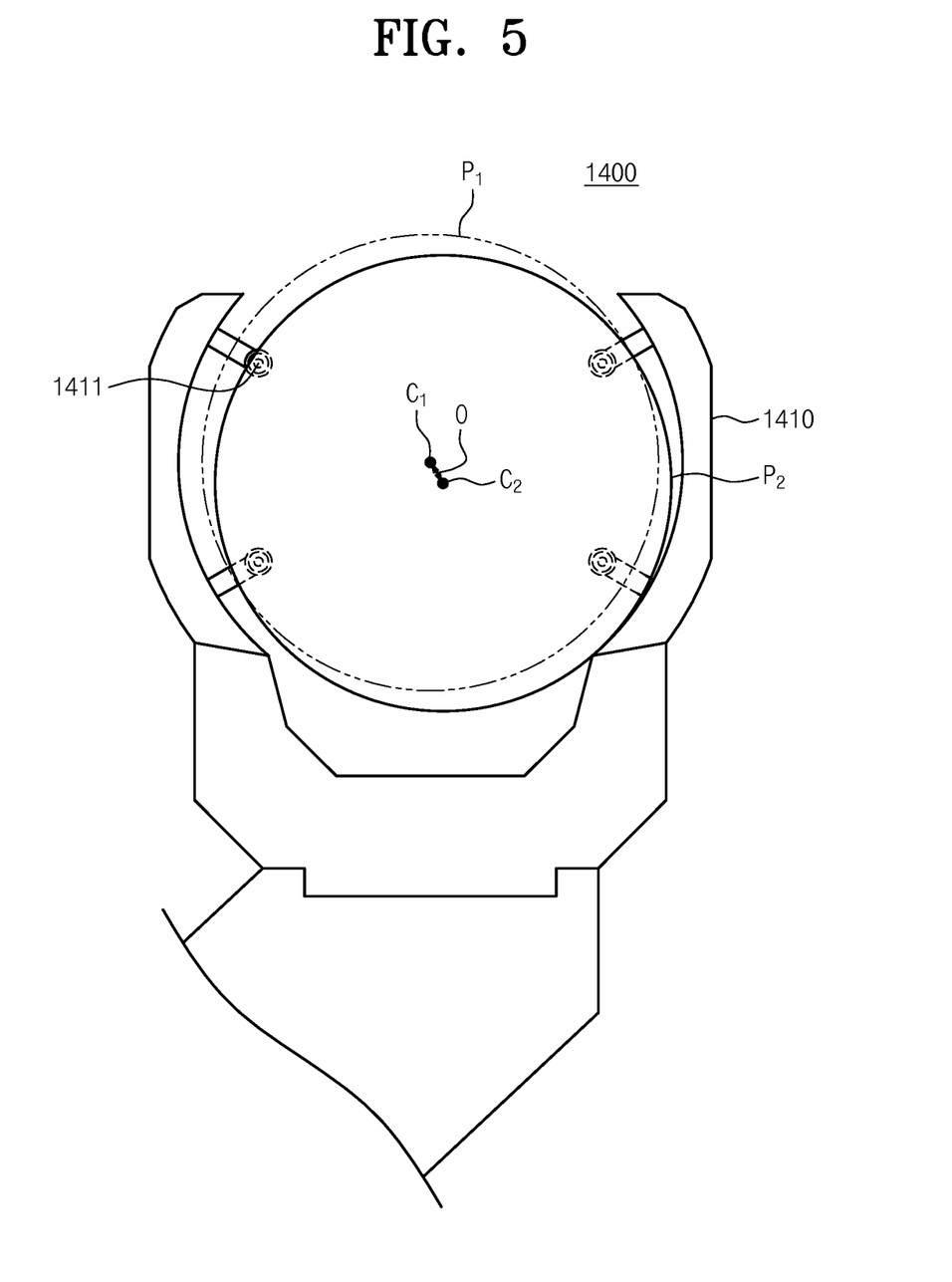
FIG. 5 is a plan view schematically showing a part of the transfer unit of FIG. 1.

FIG. 5 is a plan view schematically showing a part of the transfer unit 1400 of FIG. 1. Referring to FIGS. 1 and 5, the transfer unit 1400 transfers the substrate W onto the support unit 1200. The transfer unit 1400 includes a hand 1410, a base 1420 and a position sensor 1430.

A substrate W carried by the transfer unit 1400 places on the hand 1410. The hand 1410 is provided with a vacuum hole 1411 which forms a vacuum pressure for sucking the substrate W. A plurality of vacuum holes 1411 may be provided. The hand 1410 is provided to move linearly along the longitudinal direction of the base 1420 between a position facing the upper surface of the base 1420 and a position out of the upper surface of the base 1420. Before The hand 1410 corrects the transfer position, the transfer position for placing the substrate W on the support unit 1200 and the transfer position for lifting the substrate W from the support unit 1200 are equal to each other and remain constant. That is, the substrate W is transferred by the transfer unit 1400 according to the transfer position value once set.

The base 1420 supports hand 1410 and position sensor 1430. The base 1420 is provided so as to be movable in the vertical direction and the horizontal direction. The base 1420 is provided rotatable about the vertical direction.

The position sensor 1430 is fixedly installed on the base 1420. The position sensor 1430 measures the position of the substrate W on the hand. The position sensor 1430 may be provided in various manners of sensors capable of measuring the position of the substrate W on the hand 1410 relative to the hand 1410. For example, the position sensor 1430 may be provided with an optical sensor using light. When an optical sensor is provided as the position sensor 1430, the position sensor 1430 includes a light emitting portion and a light receiving portion. The light emitting portion may be provided at a lower portion of the hand 1410. The light emitting portion generates light. The light receiving portion is provided at a position corresponding to the light emitting portion on the upper side of the hand. The light receiving portion receives light generated by the light emitting portion. The light receiving unit and the light emitting unit are respectively provided in a ring shape by being combined with each other and separated from each other. The position sensor 1430 determines the position of the substrate W on the hand 1410 according to the amount of light received by the light receiving portion of each position.

The teaching unit 1500 sets the transfer position for transferring the substrate W onto the support unit 1200 of the transfer unit 1400. According to that the teaching unit 1500 sets the transfer position to the proper position where the substrate W can be placed in the correct position on the support unit 1200, breakage of the substrate W due to collision with another configuration in the process chamber 1100 may be prevented when the substrate W is placed in a misaligned position by the transfer unit 1400.

Hereinafter, embodiments of the substrate treating method of the present invention will be described using the substrate treating apparatuses 1000 and 2000 described above.

Figure 6:
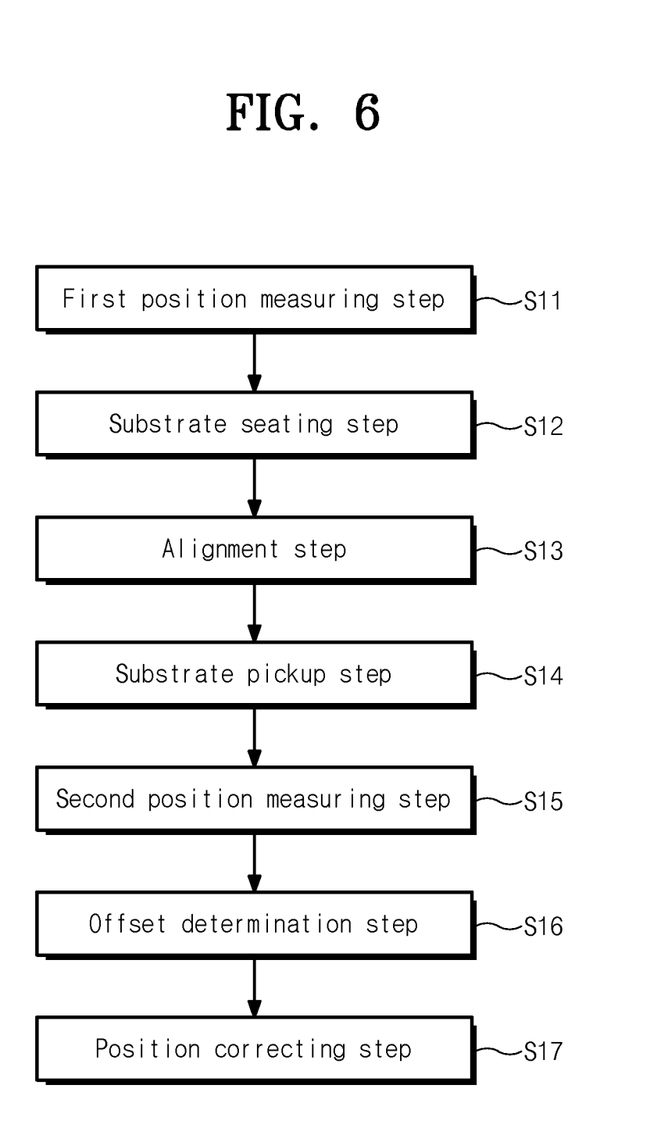
FIG. 6 is a flowchart showing a substrate treating method according to an embodiment of the present invention.

FIG. 6 is a flowchart showing a substrate treating method according to an embodiment of the present invention. Referring to FIGS. 1 and 6, the substrate treating method includes a first position measuring step S11, a substrate seating step S12, an alignment step S13, a substrate pickup step S14, a second position measuring step S15, an offset determination step S16 and a position correcting step S17. The teaching unit 1500 performs sequentially the first position measuring step S11, the substrate seating step S12, the alignment step S13, the substrate pickup step S14, the second position measuring step S15, the offset determination step S16 and the position correcting step S17 and set a transfer position for correcting the transfer position of the transfer unit 1400. The transfer position of the transfer unit 1400 is corrected in accordance with the set transfer position.

Referring to FIGS. 1 and 5, in the first position measuring step S11, the teaching unit 1500 controls the position sensor 1430 to measure the first position P1 of the substrate W placed on the hand 1410. The measured first position P1 value is transmitted to the teaching unit 1500.

In the substrate seating step S12, the teaching unit 1500 controls the transfer unit 1400 to place the substrate W placed on the hand 1410 on the support unit 1200.

In the alignment step S13, the substrate W placed on the support unit 1200 is aligned in position. Referring to FIGS. 1 and 2, a substrate W placed on a support unit 1200 in a substrate seating step S12 may be aligned in position on the support unit 1200 by alignment protrusions 1310. A detailed description of how the substrate W is properly positioned by the alignment protrusion 1310 is as described above.

Referring to FIGS. 3 and 4, in an alignment step S13, the teaching unit 1500 controls an alignment unit 2300 including a substrate rotating member 2310, a moving member 2320 and a length measuring sensor 2330 to align the substrate W to the correct position P. A detailed description of a method of positioning the substrate W using the alignment unit 1300 is as described above.

Referring again to FIGS. 1 and 5, thereafter, in the substrate pickup step S14, the teaching unit 1500 controls the transfer unit 1400 to lift the substrate W placed on the support unit 1200 from the support unit 1200.

Thereafter, in the second position measuring step S15, the teaching unit 1500 controls the position sensor 1430 to measure the second position P2 of the substrate W placed on the hand 1410. The measured second position P2 value is transmitted to the teaching unit 1500.

In the offset determination step S16, the teaching unit 1500 determines a difference value between the first position and the second position. For example, the difference value between the first position and the second position is determined by the position of the center C1 of the substrate W positioned at the first position and the position of the center C2 of the substrate W positioned at the second position.

In the position correcting step S17, the teaching unit 1500 corrects the transfer position of the transfer unit 1400 based on the difference value O determined in the offset determining step S16. That is, the teaching unit 1500 corrects the transfer position of the transfer unit 1400 so that the position of the transfer unit 1400 when placing the substrate W on the support unit 1200 is shifted by the difference value O.

In each above-described embodiment of the apparatus and method, in case that a plurality of hands of the transfer unit are provided in a stacked state, if the position or the third position of each hand is measured in the first position measuring step S11 or the third position measuring step 13, thereafter, the setting of the transfer position for one hand is complete, thereafter, the substrate W is picked up by the other hand, the substrate W placed on the support unit by the one hand is in the correct position, thereby the alignment step S13 or the rotating step S23 of the above-described methods need not be performed for the another hand.

As described above, the apparatus and method according to the embodiments of the present invention are provided so as to automatically correct the position of the transfer unit, so compared with the method of correcting the transfer position according to the position adjusted by the operator, the apparatus and method of the present invention may reduce the time required for teaching the transfer unit. Further, the apparatus and method of the present invention may accurately teach the transfer unit.

What is claimed is:

1. A substrate treating apparatus comprising:
   a support unit for supporting the substrate;
   an alignment unit for aligning the substrate placed in the support unit in position;
   a transfer unit having a hand on which the substrate is placed and a position sensor for measuring the position of the substrate on the hand, and transferring the substrate to the support unit; and
   a teaching unit for setting a transfer position for transferring the substrate onto the support unit of the transfer unit,
   wherein the teaching unit comprises a processor, and the processor executes instructions to:
   measure a first position of the substrate placed on the hand using the position sensor;
   seat the substrate placed on the hand on the support unit;
   align the substrate placed on the support unit in position;
   pick up the substrate placed on the support unit from the support unit using the transfer unit;
   measure a second position of the substrate placed on the hand using the position sensor;
   determine a difference value between the first position and the second position; and
   correct a transfer position of the transfer unit based on the difference value.

2. The apparatus of claim 1, wherein the alignment unit includes an alignment protrusion provided on the support unit, and wherein the alignment protrusion has an inclined surface inclined downward toward the center of the substrate positioned on the support unit on the inner surface.

3. The apparatus of claim 1, wherein the alignment unit includes a plurality of alignment protrusions which are provided on the support unit, wherein each of the alignment protrusions has an inclined surface inclined downward toward the center of the substrate positioned on the support unit on the inner surface, and wherein a plurality of the alignment protrusions are spaced apart from each other so as to surround the substrate positioned on the support unit.

4. The apparatus of claim 3, wherein the inner ends of the alignment protrusions are provided in contact with or adjacent to the side of the substrate positioned on the support unit.

5. The apparatus of claim 1, wherein the alignment unit comprises:
a substrate rotating member for rotating a substrate placed on the support unit;
a moving member for moving the support unit in a horizontal direction; and
a length measuring sensor for measuring the length of the rotating substrate from the center of a rotation of the rotating substrate to an end facing in a predetermined direction of the rotating substrate.

6. The apparatus of claim 5, wherein the processer controls the moving member to move the support unit such that the substrate is positioned in accordance with the length value measured by the length measuring sensor in the aligning of the substrate.

7. The apparatus of claim 6, wherein the length measuring sensor measures the length during one revolution of the substrate.

8. The apparatus of claim 1, wherein the hand is provided with a vacuum hole forming vacuum pressure to adsorb the substrate.

9. A substrate treating apparatus comprising:
a support unit for supporting the substrate and rotating the substrate;
a transfer unit having a hand on which the substrate is placed and a position sensor for measuring the position of the substrate on the hand, and transferring the substrate to the support unit; and
a teaching unit for setting a transfer position for transferring the substrate onto the support unit of the transfer unit,
wherein the teaching unit comprises a processor, and the processor executes instructions to:
measure a first position of the substrate placed on the hand;
seat the substrate placed on the hand on the support unit;
rotate the substrate at a predetermined angle;
pick up the substrate placed on the support unit from the support unit using the transfer unit;
measure a second position of the substrate placed on the hand;
use a measured value of the first position and the second position in the first position measuring step and the second position measuring step to determine a difference value between the first position and a position of the substrate picked up by the hand when the substrate is placed in the support unit in position; and
correct a transfer position of the transfer unit based on the difference value.

10. The apparatus of claim 9, wherein the hand is provided with a vacuum hole forming vacuum pressure to adsorb the substrate.

11. The apparatus of claim 9, wherein the predetermined angle is 180 degrees.

12. A substrate treating method comprising:
a first position measuring step for measuring a first position of a substrate placed on a hand of a transfer unit for transferring a substrate to a support unit for supporting the substrate by using a position sensor;
a substrate seating step for seating the substrate placed on the hand on the support unit by the transfer unit;
an alignment step of aligning the substrate placed on the support unit in position by alignment protrusions;
a substrate pickup step for picking up the substrate placed on the support unit from the support unit using the transfer unit;
a second position measuring step for measuring a second position of the substrate placed on the hand by using the position sensor;
an offset determination step for determining a difference value between the first position and the second position by a teaching unit; and
a position correcting step for correcting a transfer position of the transfer unit based on the difference value by the teaching unit.

13. The method of claim 12, wherein in the alignment step, the alignment protrusions provided on the support unit with inclined surfaces inclined downward toward the center of the substrate positioned on the support unit on the inner surface are used to align the substrate in place.

14. The method of claim 12, wherein in the alignment step, the substrate placed on the support unit is rotated, and while the substrate is rotating, the length of the rotating substrate from a center of a rotation of the rotating substrate to an end of the rotating substrate facing in a predetermined direction is measured, and the support unit is moved so that the substrate is positioned in a correct position in accordance with the length value measured by the measurement.

15. The method of claim 14, wherein the length measurement is performed during one revolution of the substrate.

16. A substrate treating method comprising:
a first position measuring step for measuring a first position of the substrate placed on the hand of a transfer unit for transferring a substrate to a support unit for supporting the substrate by using a position sensor;
a substrate seating step for seating the substrate placed on the hand on the support unit by the transfer unit;
a rotating step for rotating the substrate at a predetermined angle by the support unit;
a substrate pickup step for picking up the substrate placed on the support unit from the support unit using the transfer unit;
a second position measuring step for measuring a second position of the substrate placed on the hand by using the position sensor;
an offset determination step for using a measured value of the first position and the second position in the first position measuring step and the second position measuring step to determine a difference value between the first position and a position of the substrate picked up by the hand by a teaching unit when the substrate is placed in the support unit in position; and
a position correcting step for correcting a transfer position of the transfer unit based on the difference value by the teaching unit;
wherein the steps are sequentially performed to set the transfer position of the transfer unit.

17. The method of claim 16, wherein the predetermined angle is 180 degrees.

* * * * *